(12) United States Patent
Anderson

(10) Patent No.: US 6,765,812 B2
(45) Date of Patent: Jul. 20, 2004

(54) ENHANCED MEMORY MODULE ARCHITECTURE

(75) Inventor: David R. Anderson, Rock Port, MO (US)

(73) Assignee: Honeywell International Inc., Morristown, NJ (US)

(*) Notice: Subject to any disclaimer, the term of this patent is extended or adjusted under 35 U.S.C. 154(b) by 184 days.

(21) Appl. No.: 10/053,031

(22) Filed: Jan. 17, 2002

(65) Prior Publication Data

US 2002/0133684 A1 Sep. 19, 2002

Related U.S. Application Data

(60) Provisional application No. 60/262,472, filed on Jan. 17, 2001.

(51) Int. Cl.[7] .................................................. G11C 5/02
(52) U.S. Cl. ............................ 365/51; 365/63; 365/52; 439/637
(58) Field of Search ........................ 365/51, 52, 230.03, 365/200, 63; 439/637; 361/760, 736

(56) References Cited

U.S. PATENT DOCUMENTS

| | | | |
|---|---|---|---|
| 4,850,891 A | | 7/1989 | Walkup |
| 5,721,860 A | | 2/1998 | Stolt |
| 5,790,447 A | * | 8/1998 | Laudon et al. ............... 365/52 |
| 5,982,655 A | | 11/1999 | Doyle ........................ 365/63 |
| 6,067,593 A | | 5/2000 | Schade ...................... 710/126 |
| 6,078,515 A | * | 6/2000 | Nielsen et al. ............... 365/63 |
| 6,111,757 A | | 8/2000 | Dell et al. .................. 361/737 |
| 6,173,382 B1 | | 1/2001 | Dell et al. .................. 711/170 |
| 6,285,558 B1 | * | 9/2001 | Frantz et al. ................ 361/760 |
| 6,298,426 B1 | | 10/2001 | Ajanovic ..................... 711/172 |
| 6,353,539 B1 | * | 3/2002 | Horine et al. ............... 361/736 |

OTHER PUBLICATIONS

"Advanced Information: MPC107 PCI Bridge/Memory Controller Technical Summary," Motorola Semiconductor Products Sector, vol. mpc 107 ts/d, No. 0, Sep. 1999, pp. 1–16, XP002249907, p. 8, paragraph 1.3.2; figures 1–1.

* cited by examiner

*Primary Examiner*—Vu A. Le
*Assistant Examiner*—N. Nguyen

(57) ABSTRACT

A memory module architecture that supports Flash and static memory devices in addition to dynamic memory devices. The module architecture of the present invention preferably redefines standard application of chip select signals on existing module architectures to provide requisite signaling to support Flash and static RAM devices. Use of serial presence detect signaling features of standard memory modules is also modified to provide desired identity and parameters of such an enhanced module. Extending the range of supported memory devices in an otherwise standard memory module reduces the need for special designs to accommodate different and evolving types of memory and is therefore particularly applicable to embedded systems where a variety of memory types are often utilized. A further aspect of the present invention provides for a support structure to immobilize the loose edge of the memory module opposite the electrical edge connector of the module to further enhance the module's resistance to vibration and mechanical shock by immobilizing the module with respect to rotation about the key in the socket connector.

36 Claims, 3 Drawing Sheets

ENHANCED MEMORY MODULE ARCHITECTURE

RELATED APPLICATIONS

This patent application is related to, and claims priority to, U.S. Provisional Patent Application Serial No. 60/262,472, entitled "FLEXIBLE MEMORY ARCHITECTURE FOR POWER PC EMBEDDED SYSTEMS", filed Jan. 17, 2001, and is hereby incorporated herein by reference.

BACKGROUND OF THE INVENTION

1. Field of the Invention

The invention relates to memory module architectures and in particular relates to an enhanced memory module configuration to provide additional flexibility in memory module applications in conjunction with PowerPC and other system applications.

2. Discussion of Related Art

Present-day computing systems often utilize standardized memory modules to add memory capacity to a system. A memory module is generally comprised of a number of memory chips mounted on a printed circuit card adapted for insertion into a standard carrier or socket connector. The module is easily added or removed from a system to permit flexible configuration of memory capacity. The module and socket adhere to a standardized pin assignment for exchange of signals between a system bus and the memory chips. Signals are routed from the carrier connector to the memory chips in accordance with the particular standard used for the module and the particular memory chips selected by the memory module manufacturer.

A number of standards are defined for such modules. Exemplary of one such standard is a so-called 144-pin Small Outline DIMM module (also referred to as "SO-DIMM") as defined by the JEDEC JESD21-C standard specification (available online at www.jedec.org). The 144-pin SO-DIMM provides a convenient, compact design for use in space-constrained applications such as portable computing devices or embedded systems. The module is a small printed circuit card with memory devices mounted thereon and one edge that provides electrical connectivity of up to 144 signals when the module is inserted into a mated connector on the main system board (i.e., the system motherboard). The printed circuit card signal traces connect standard signals assigned to the 144 pins of the module's edge connector to appropriate pins of the memory chips mounted thereon. A memory controller on the system board exchanges these standard memory control signals with the module through the mated connector.

In particular, the 144-pin standard module provides for memory chips to be mounted on one or both physical sides of the printed circuit board. A select signal is typically applied to the module by a CPU or memory controller to select the memory chips on one or the other side of the memory module for exchange of data and control signals. This select signal is often referred to as a "row select" signal in regards to the 144-pin standard configuration. When the "front" side is selected by the memory controller, only those chips respond to the exchange of signals with the system board. Similarly, when the "back" side is selected, only those memory chips respond to the memory controller signals.

Most memory modules and carriers define signal connections for standard DRAM memory devices (dynamic random access memory) mounted on the module. Such signal definitions include signals common to most DRAM devices including, in particular, SDRAMs (synchronous DRAM devices). Other forms of memory, in particular asynchronous memories, are not generally accommodated by the standard signal paths provided for on the standard DIMM memory module. For example, present standard DIMM modules such as the 144-pin SO-DIMM do not support so-called Flash memory devices. Neither are static RAMs (SRAM devices) generally supported by such standard DIMM modules.

This presents a particular problem to embedded applications where a wide variety of memory devices are often applied to resolve special problems in particular applications. For example, the non-volatile nature of Flash memory devices makes them particularly useful in many embedded applications for storage of computer program instructions while a standard SDRAM may be used for storage and retrieval of program data. Since no single standard memory module supports such a variety of memory devices, it is often necessary to design embedded applications for multiple memory module architectures and associated busses and/or to redesign the system as the memory requirements change or new memory components become available. For example, it is common in many such embedded applications to design a first memory bus for exchange of signals with synchronous memory components (i.e., SDRAMs) and a separate slower memory bus for asynchronous devices such as Flash or static RAMs. This added complexity adds cost and size to the design and complicates portability of a system design to multiple applications that may have different needs for memory configuration.

Furthermore, it is a problem for many such memory module designs to be used in embedded applications where there is significant vibration or mechanical shock. Standard DIMM modules insert into a mated socket at one edge. Some DIMM modules are designed to latch or lock on two other sides of the module. However, the edge opposing the socket is often unsupported and may lead to failures in applications of high vibration and mechanical shock. In particular it has been found that under certain common vibrational modes, the SO-DIMM module may twist about a pivot point at the key in the DIMM socket. Sufficient twisting due to such vibration can lead to unacceptable, premature DIMM module failure.

It is evident from the above discussion that a need exists for an improved memory module design that permits a wider variety of memory device types to be used in a standard DIMM socket on a common bus. It is further evident that a need exists for an improved mechanical design for a memory module that better withstands high vibration environments or environments that may entail significant mechanical shock.

SUMMARY OF THE INVENTION

The present invention solves the above and other problems, thereby advancing the state of the useful arts, by providing a modified memory module design that accommodates a wider variety of memory devices. In particular, the modified memory module architecture of the present invention redefines a number of standard signals to permit utilization of Flash and static memory components in a DIMM module while maintaining backward compatibility to standard DRAM and SDRAM DIMM modules. Still more specifically in one exemplary preferred embodiment, the present invention preferably utilizes row select signals ("CS (0:1)") of a standard 144-pin SO-DIMM module to provide requisite select and control signals for Flash and static memory devices.

Still more specifically, where a memory controller is capable of multiplexing both synchronous and asynchronous memory device accesses over the same signal paths, the present invention permits use of Flash and other special memory modules that are physically compatible with SO-DIMM configurations in conjunction with typical SDRAM (or other DRAM) SO-DIMM modules over the same multiplexed memory controller bus signals. For example, the Motorola family of embedded PowerPC microcomputers (MPC824x and others) includes such a memory controller—specifically the MPC107 memory controller. The MPC106 or MPC107 memory controller device provides such a memory controller feature and is integrated into the MPC824x chip die and available as a separate integrated circuit component. Systems using the MPC106 or MPC107 memory controller as a separate component may also benefit from the present invention. Further, other similarly featured memory controllers are commercially available and systems using such similarly featured memory controller may beneficially apply the features of the present invention.

In one particularly useful embodiment, the signals of a JEDEC JESD21-C 144-pin SO-DIMM standard memory module are modified to enable support of Flash and SRAM memory devices on the modified standard DIMM module. In particular, the chip select (row select) signals are modified to provide the requisite selection of Flash and SRAM memory components in addition to standard SDRAM (or DRAM) memory components. Setting of jumpers on the system board preferably indicate the presence of such additional memory device types in the SO-DIMM sockets of the system and adapt the signal exchange with a memory controller to conform to the signaling requirements of the special module. A single bus structure supports both synchronous and asynchronous memory device signals and couples the memory controller to multiple SO-DIMM sockets. Each DIMM socket may be populated with a Flash or SRAM special memory module or with a standard SDRAM or DRAM memory module. The design may then be easily ported to other applications requiring a different compliment of memory device types.

In this first exemplary preferred embodiment, a variety of memory configurations are achievable. In this first exemplary preferred embodiment, the system utilizes a DIMM module similar to that defines as the 144-pin SO-DIMM standard referenced above. In such memory modules, the module may be populated on one or both sides of the module printed circuit card with memory devices. All memory devices on one side typically respond to the same select signal. The select signal is usually referred to as a "row select" as noted above. As used herein, the terms "row" and "side" are used synonymously with respect to such SO-DIMM modules. Those skilled in the art will note however that it is not required that all memory devices on one side of a module respond to a single select signal. Rather, in accordance with the module standard, the physical place of the memory devices on the module is irrelevant with respect to the select signals. Use of the terms "row" and "side" as essentially synonymous is therefore not intended to limit the invention to a particular physical layout of memory modules. Rather, the terms are both used to broadly refer to a first subset of memory devices on a module that respond to a first row select signal and a second subset of memory devices that respond to a second row select signal.

With two DIMM sockets in an exemplary system configuration, each socket may be populated with a standard SDRAM SO-DIMM where the DIMM is limited to single row configurations (i.e., SDRAM memory devices responding to only one row select of the module). Alternatively, only one DIMM socket may be populated with a double-row SO-DIMM module. The double-row DIMM may provide SDRAM devices on both rows, SDRAM on one row and Flash or other asynchronous devices on the other. In yet another alternative, a first single row DIMM may provide SDRAM memory devices and a second single row DIMM may provide Flash or other asynchronous memory devices. Jumper configurations on the system printed circuit board can then be used to route the row select signals as appropriate for the particular application.

In an alternative embodiment of the present invention, use of the serial presence detect ("SPD") signaling standard of DIMMs provides the required identity of the special modules supporting the extended range of memory device types. The SPD feature of memory modules provides for a simple serial interface (usually $I^2C$ protocol compliant) to return to the system certain identification and configuration information regarding the memory module. The memory controller of the system is then programmed to adapt its signaling as required for the sensed memory configuration. An application specific integrated circuit (ASIC) could be used in addition to a memory controller or in place of a memory controller to provide desired address processing. In general, a system CPU would preferably sense the configuration of memory modules in the sockets by reading and decoding the SPD information and program the memory controller and/or ASIC device to provide appropriate address decoding and timing according to the specific compliment of memory modules found in the system.

Another aspect of the present invention provides a support structure for the DIMM edge opposite the connector edge to enhance the module's resistance to vibration and mechanical shock. The present invention provides a support structure associated with the edge of a SIMM module opposite the connector edge of the DIMM. The support structure prevents a module inserted in the SO-DIMM socket from rotating or twisting within the socket connector. In particular, the present invention preferably prevents the module from twisting about an axis centered at the key of the module socket.

In one exemplary preferred embodiment representing the best presently known mode of practicing the invention, the module is adapted with holes at the corners, each overlaying a swaged extension nut or standoff on the motherboard or system board. The holes and associated nut or standoff are preferably positioned at the corners of the module opposite the connector edge of the module. The module is inserted in the mated connector and preferably secured with screws or other fasteners to the standoff or extension nut to immobilize the module and prevent undesired twisting of the module in the socket.

A first feature of the invention provides for a memory module comprising: a printed circuit assembly having connector pads at one edge of the assembly; and a plurality of memory devices mounted on the assembly and electrically coupled to the connector pads such that the printed circuit assembly is adapted to support both synchronous and asynchronous types of the memory devices.

Another aspect further provides that each of the plurality of memory devices is a synchronous dynamic random access memory device.

Another aspect further provides that each of the plurality of memory devices is a synchronous Flash memory device.

Another aspect further provides that each of the plurality of memory devices is an asynchronous Flash memory device.

Another aspect further provides that each of the plurality of memory devices is an asynchronous static random access memory device.

Another aspect further provides that each of the plurality of memory devices is an asynchronous fast static random access memory device.

Another aspect further provides that each of the plurality of memory devices is an asynchronous low power static random access memory device.

Another aspect further provides that the connector pads include: a first select signal connector pad that selects a first subset of memory devices mounted on the module when a signal is applied thereto such that the first subset of memory devices are synchronous memory devices; and a second select signal connector pad that selects a second subset of memory devices mounted on the module when a signal is applied thereto such that the second subset of memory devices are asynchronous memory devices.

Another aspect further provides that the connector pads include: a first select signal connector pad that selects a first subset of memory devices mounted on the module when a signal is applied thereto such that the first subset of memory devices are synchronous dynamic random access memory devices; and a second select signal connector pad that selects a second subset of memory devices mounted on the module when a signal is applied thereto such that the second subset of memory devices are synchronous Flash memory devices.

A second feature of the invention provides for a system comprising: a system board; a memory bus adapted for exchanging signals between a memory controller and both synchronous and asynchronous memory devices; a memory controller on the system board coupled to the memory bus such that the memory controller is capable of generating signals for control of both synchronous and asynchronous memory devices and such that the memory controller is capable of multiplexing the signals on the memory bus; a first socket connector on the system board for receiving a first memory module such that the first socket connector is coupled to the memory controller through the memory bus; and a first memory module inserted in the first socket connector and electrically coupled to the memory controller such that the first memory module includes a plurality of synchronous or asynchronous memory devices.

Another aspect further provides for a jumper on the system board for configuring signals exchanged between the memory controller and the first memory module in accordance with the type of memory devices on the first memory module.

Another aspect further provides that the first memory module provides serial presence detect information used in conjunction with the memory controller to identify the type of memory devices included on the first memory module.

Another aspect provides for a second socket connector on the system board for receiving a second memory module such that the second socket connector is coupled to the memory controller through the memory bus; and a second memory module inserted in the second socket connector and electrically coupled to the memory controller such that the second memory module includes a plurality of synchronous or asynchronous memory devices.

Another aspect further provides for a jumper on the system board for configuring signals exchanged between the memory controller and the second memory module in accordance with the type of memory devices on the first memory module and on the second memory module.

Another aspect further provides that the first memory module provides serial presence detect information used in conjunction with the memory controller to identify the type of memory devices included on the first memory module, and that the second memory module provides serial presence detect information used in conjunction with the memory controller to identify the type of memory devices included on the second memory module.

A third feature of the invention provides for a system comprising: a system board; a socket connector on the system board for receiving a memory module such that the socket connector includes a key; a memory module having a connector edge inserted in the socket connector and having an opposing edge opposite the connector edge such that the memory module has a notch mated to the key when the memory module is inserted in the socket connector; and a memory module retainer adapted to substantially immobilize the opposing edge with respect to rotation about the key.

Another aspect further provides that the memory module retainer comprises: a nut affixed to the system board; a hole in the memory module along the opposing edge and aligned with the nut; and a screw inserted through the hole into the nut to substantially immobilize the opposing edge with respect to rotation about the key.

Another aspect provides that the nut is a swaged extension nut.

Another aspect provides that the memory module retainer comprises: a half card-cage affixed to the system board such that the half card-cage includes a channel for receiving the opposing edge of the memory module to substantially immobilize the opposing edge with respect to rotation about the key.

Another aspect provides that the memory module retainer comprises: a standoff pin affixed to the system board; a hole in the memory module along the opposing edge and aligned with the pin such that the standoff pin extends through the hole and locks when the memory module is completed inserted in the socket connector to substantially immobilize the opposing edge with respect to rotation about the key.

Another aspect provides that the memory module retainer comprises: a standoff pin affixed to the socket connector, a hole in the memory module aligned with the standoff pin such that the standoff pin extends through the hole and when the memory module is completed inserted in the socket connector to substantially immobilize the opposing edge with respect to rotation about the key.

DETAILED DESCRIPTION OF THE PREFERRED EMBODIMENTS

Figure 1:
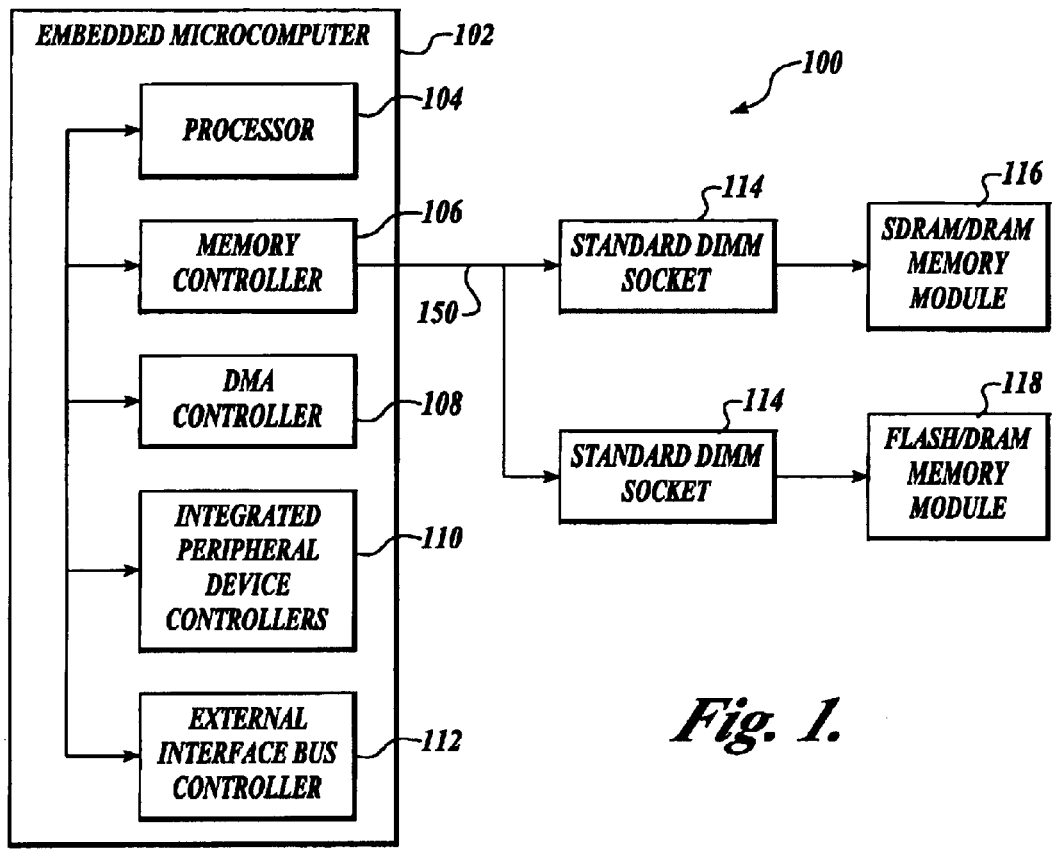
FIG. 1 is a block diagram of an exemplary preferred embodiment of a system using enhanced memory modules in accordance with the present invention.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 is a block diagram of a system 100 in which an embedded microcomputer interfaces with a variety of memory modules 116 and 118 via memory bus 150 and standard memory module socket connectors 114. Embedded microcomputer 102 preferably includes at least a processor 104 and a memory controller 106 to control and interact with memory modules 116 and 118. In one exemplary preferred embodiment of such a system, embedded microcomputer 102 may be a Motorola PowerPC MPC8245 or other similar members of that embedded microcomputer family. The MPC8245 includes a memory controller for interaction with, and control of, a variety of memory devices.

Figure 3:
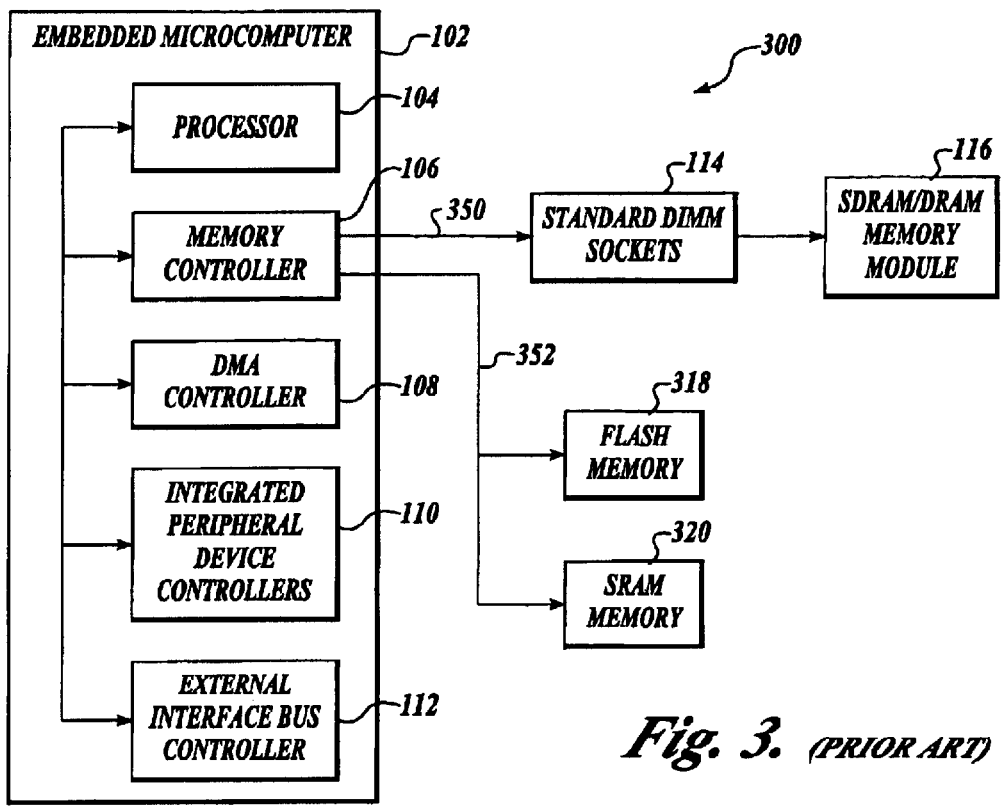
FIG. 3 is a block diagram depicting a typical system as presently practiced in the art with separate bus structures for support of different memory types.

FIG. 3 shows a system 300 using the same embedded microcomputer 102 adapted as known in the art to interact with standard SO-DIMM SDRAM (or DRAM) memory modules through a synchronous bus structure 350 while interacting with other memory devices (Flash 318 or SRAM 320) through a slower asynchronous memory bus 352. As noted above, such a structure requires each system application to uniquely adapt to a particular memory configuration. The system cannot be easily re-used for different applications requiring different memory configurations.

Returning now to FIG. 1, by contrast and in accordance with the present invention, the memory control signals are all directed over the same multiplexed memory bus 150 to memory modules 116 and 118. The memory modules 116 and 118 are preferably adapted to SO-DIMM standard mechanical dimensions. As noted above, memory controller 106 is capable of multiplexing both synchronous memory control signals and asynchronous memory control signals over the same bus, Such a memory controller is embedded within an MPC8245 and other embedded microcomputers. Further, as noted above, those skilled in the art will readily recognize equivalent system architectures in which the memory controller element 106 is a separate and distinct integrated circuit component not embedded within the same chip die as the processor. For example, the MPC106 or MPC107 memory controller as well as other commercially available memory controller devices provide the desired multiplexing of synchronous and asynchronous memory signals over a common memory interface bus.

The memory bus signals are preferably directed through standard DIMM memory module connectors 114 to any of a variety of DIMM memory modules. For example, standard 144-pin SO-DIMM memory module 116 may provide standard DRAM or SDRAM memory devices. Flash/SRAM memory module 118 is adapted in accordance with the present invention to provide a 144-pin interface similar to that of the standard 144-pin DIMM 116. DIMM memory module 118 is adapted in accordance with the present invention to apply control signals from memory controller 106 to Flash or static memory devices (i.e., SRAM devices including low power SRAM, high-speed SRAM, etc.). Further, as noted above, a custom DIMM module may be utilized that provides SDRAM (or other DRAM) devices responding to a first row select signal and Flash or other asynchronous devices that respond to a second row select signal.

Other components may be embedded within microcomputer 102 including, for example, a DMA controller 108, integrated I/O peripheral device controllers 110, and external interface bus controllers 112 (i.e., PCI, PCMCIA, etc.). Those skilled in the art will recognize that the devices shown in FIG. 1 are intended as one exemplary embodiment of a system that may advantageously apply the enhanced memory architecture of the present invention.

As noted above, one standard DIMM configuration is defined by JEDEC specification JESD21-C as a 144-pin SO-DIMM memory module. This particular memory module is useful in a number of applications due to its small footprint. The small module is effective in portable systems including avionics systems and other embedded systems to conserve space required for memory expansion.

In one exemplary preferred embodiment of the invention, the signals of such a standard 144-pin DIMM are adapted to permit use of a wider variety of memory devices in the memory module configuration. Those skilled in the art will recognize that the features of the present invention may be easily adapted to other memory module configurations and standards. The exemplary preferred embodiment of the invention as a 144-pin SO-DIMM structure is not intended to limit the applicability of the invention to other memory modules. Rather, it is intended to express one particularly useful application for embedded and portable system applications.

The flexible memory architecture of the present invention allows a single system design to be applied to a number of different applications potentially requiring different memory configurations. By way of example, a first system may provide a large system such as an avionics Primary Flight Display. Such systems are often referred to as "Level A" or "mission critical" in the avionics and aerospace industries. Such a large system may use of a full 72-bit (64+8 check bits) ECC SDRAM module in a first DIMM module socket of the system to enhance system reliability through error correction. This memory module would preferably be a single row SO-DIMM module selected by a "front-side" select pin of a standard DIMM socket. As noted herein above, use of the term "side", "front-side" or "back-side" is to be understood as synonymous with "row" as defined for the standard 144-pin SO-DIMM module of an exemplary preferred embodiment. This SDRAM module would serve as storage for dynamic data and scratchpad memory for the system. Those skilled in the art will note that the number and size of memory devices presently commercially available and required to implement a 72-bit ECC module would consume both sides of the module. However, expected advancements and market demands will easily allow for such a memory module in a single row configuration. The application program instructions in such a system would preferably be stored in a Flash memory module inserted in the second module socket. The Flash module would also preferably be a single row module selected by a "back-side" select pin on the SO-DIMM standard socket. The width, depth, and timing characteristics for Flash module memory accesses are preferably programmed into the memory controller by boot code operable at system startup and reset.

A second system application of the same system board could provide a very small system, such as a Frequency Control Head for a remote radio. The criticality of such a system application may be such that ECC reliability is not required on the data memory. Also the data memory and application size and performance requirements may be such that a 32-bit bus width is sufficient. In this case the data memory would preferably be 32-bit wide SDRAM totaling perhaps 4 megabytes in an SO-DIMM module populated on one side with SDRAM devices. The SDRAM devices are preferably selected by a "front-side" select pin of the DIMM socket. The application program instructions could be stored in 32-bits of SyncFlash™ (a trademarked technology of Micron Technology, Inc.) on the other side of the same module and responding to the "back-side" select signal. SyncFlash™ memory devices provide Flash memory features but present an addressing and control interface substantially similar to that of SDRAM. Both rows of this custom module may therefore be addressed as though containing standard SDRAM synchronous memory devices. Thus a single custom DIMM module may provide all the necessary memory for this small system application and still uses the same SO-DIMM standard socket.

A third system application of the same system board could provide the same Control Head using standard Flash and SRAM on different rows of a single custom SO-DIMM. Such a module might use 2 2M×16-bit asynchronous Flash memory devices on one side for a total of 8 MB selected by the second row select pin logically ANDed with the un-inverted highest used address bit. This ANDing can be accomplished by single-gate logic available from several logic vendors. The same custom SO-DIMM module might also use 4 1M×8-bit asynchronous SRAM memory devices for a total of 4 MB. This SRAM would preferably also be selected by the second row select signal ANDed with the inverted highest used address bit. In this preferred embodiment, both the synchronous Flash and the asynchronous SRAM would be selected by the second row ("back-side") select signal with the highest used address bit used to differentiate between the two types of memory.

The flexible memory architecture of the present invention allows all three systems to use the exact same system board design—a desirable benefit to ease certification of systems in avionics and aerospace industries as well as other high-reliability applications. All three systems can use the exact same software if the boot code configures the memory controller from SPD data retrieved from the module(s) (as discussed further herein below)—another benefit to reliability certification requirements. Further, as memory device packaging evolves, a new SO-DIMM module can be easily adapted to the modified signaling of the present invention. The system board, CPU and memory controller need not be re-designed to utilize improved memory devices. Further, use of standard SO-DIMMs for all memory requirements of such systems helps minimize footprint requirements in space constrained applications.

The table below describes one exemplary preferred embodiment for the connection of standard memory controller signals generated by a typical memory controller to an enhanced DIMM in accordance with the present invention. The signals of the memory controller in the first three columns are expressed in the table as the signals generated by the memory controller element within a Motorola MPC8245 embedded microcomputer (i.e., the MPC107 memory controller). This memory controller is exemplary of a large number of memory controllers that may be useful in controlling memory modules of the present invention. Those skilled in the art will recognize a variety of other memory controller devices, both as separate devices and integrated within a microcomputer, that are capable of controlling a variety of synchronous and asynchronous memory devices over a common bus.

The first column indicates the signals used in connecting the memory controller to a standard SDRAM module. The second column indicates the signals used in connecting the memory controller to an asynchronous Flash or SRAM memory module. The third column indicates the signals used in connecting the memory controller to a burst/page Fast Flash or SRAM module. When a signal is not used for a particular module type, "NU" so designates an unused connection.

| Synch. SDRAM Module | Asynch. FLASH/ SRAM Module | Burst/Page Fast Flash/ SRAM Module | Connector/Module Pin Numbers |
| --- | --- | --- | --- |
| D(0:31) | D(0:31) | D(0:31) | 138,136,134,132,128,126,124,122,100, 98,96,94,90,88,86,84,54,52,50,48,44, 42,40,38,20,18,16,14,10,8,6,4 |
| D(32:63) | D(32:63) | D(32:63) | 137,135,133,131,127,125,123,121,99, 97,95,93,89,87,85,83,53,52,49,47,43,41,39,37,1 9,17,15,13,9,7,5,3 |
| DQM_n(0:7) | NU | NU | 23,25,115,117,24,26,116,118 |
| MA(14) | XA(24) | XA(24) | Not currently supported, would probably be pin 73 on SDRAM module. |
| MA(13) | XA(23) | XA(23) | 72* |
| MA(12) | XA(22) | XA(22) | 70** |
| SDBA0 | XA(11) | XA(11) | 106 |
| SDBA1 | XA(20) | XA(20) | 110 |
| MA(0:11) | XA(0:10,21) | XA(0:10,21) | 29,31,33,30,32,34,103,104,105,109,111,112 |
| CB(0:7) | XA(19:12) | XA(19:12) | 57,59,77,79,58,60,78,80 |
| RAS_n | NU | NU | 65 |
| CAS_n | NU | NU | 66 |
| WE_n | WE_n | WE_n | 67 |
| CKE(0:1) | NU | NU | 62,68*** |
| CLK(0:1) | NU | CLK | 61,74**** |
| SDA | SDA | SDA | 141 |
| SCL | SCL | SCL | 142 |
| DNU | OE_n | OE_n | 73 (this is defined for EDO and FP DRAM modules) |

-continued

| Synch. SDRAM Module | Asynch. FLASH/ SRAM Module | Burst/Page Fast Flash/ SRAM Module | Connector/Module Pin Numbers |
|---|---|---|---|
| S_n(0:1) | CE_n | CE_n and ADV_n | 69,71***** (use pin 69 to select single-row SDRAM modules, pin 71 to select FLASH) |
| VDD | VDD | VDD | 11,12,27,28,45,46,63,64,81,82,101,102, 113,114,129,130,143,144 |
| VSS | VSS | VSS | 1,2,21,22,35,36,55,56,75,76,91,92, 107,108,119,120,139,140 |
|  | RESET_n | RESET_n | 72* |

Notes regarding above table entries:
*Seldom used pins, MA(13) not supported on 54-pin devices up to 256Mb. There is a reserved pin for higher density parts in this package.
**MA(12) is seldom used, supported ONLY for 256Mb parts.
***Sometimes used on single row modules (required by PC100/PC133). Loading on MPC824x not affected. Included here to allow possibility of use of COTS SDRAM modules.
****Second CLK is sometimes used in 1-Row modules to reduce loading and balance clock trees.
*****Sharing FLASH and SRAM select requires address decoding on the module.

Those skilled in the art will recognize other mappings of memory controller signals appropriate to control the above and other types of memory modules. The above mappings of signals are therefore intended as representative of one exemplary preferred embodiment of the invention to provide a flexible memory architecture for use of SO-DIMM modules. Further, as noted above, those skilled in the art will recognize pin assignments for signals that may be used for other memory module configurations and standards.

Figure 2:
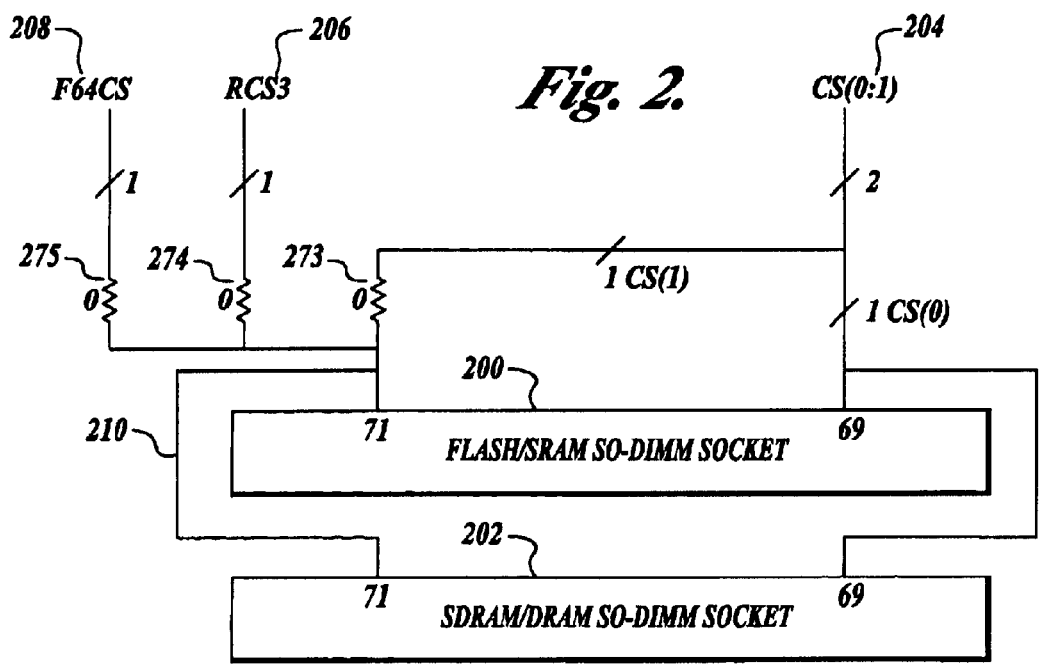
FIG. 2 is a schematic diagram showing relevant portions of an exemplary preferred embodiment of a DIMM socket connector with modified row select signals in accordance with the present invention.

FIG. 2 is a schematic drawing showing relevant portions of signals used in a first exemplary preferred embodiment of the present invention. Those skilled in the art will recognize from the tables above that numerous other signals required for accessing each type of memory device are removed from FIG. 2 to simplify the drawing.

FIG. 2 shows a portion of a system having two sockets (connectors) for insertion of SO-DIMM memory modules. The first of the two sockets 202 may preferably be used for a standard SDRAM (or DRAM) SO-DIMM module to provide standard dynamic RAM features for program instruction and data storage and retrieval. The second socket 200 may preferably be reserved for a special module such as a Flash memory module or static RAM memory module adapted in accordance with the present invention for use in a modified 144-pin SO-DIMM socket.

In a first exemplary preferred embodiment as shown in FIG. 2, the row select signals (CS(0:1)) 204 are handled differently from the standards DEFINED for the 144-pin SO-DIMM. In particular, the first signal of the row select signals (CS(0)) is preferably used in accordance with the standards defined for the module to select the front side (the first row) of the addressed module. CS(0) is therefore preferably connected to pin 69 of the standard SO-DIMM socket. In this exemplary preferred embodiment, standard SDRAM (or DRAM) SO-DIMMs are preferably limited to single-row configurations so that the second row select signal is not needed for SDRAM (or DRAM) addressing. Rather the second row select signal is provided by one of a plurality of configurable sources to select the Flash or asynchronous memory device in second socket 200 using pin 71 of the SO-DIMM standard socket. A first source of the second row select signal is the row select signal as normally generated by the memory controller (CS(1) to thereby permit use of any standard SO-DIMM module including double-row modules). Other sources for the second row select signal generation are programmable chip select signals generated by the memory controller of the MPC824x microcomputer memory controller (or other similarly featured memory controller). Specifically, the F64CS control signal (generated by an MPC8240 with a separate address decoder ASIC) and the RCS(0:3) control signals (generated by an MPC8245) may be used as a second row select signal when an address is decoded as referencing the asynchronous memory device on a second module in the second SO-DIMM socket 200.

As noted above, in a first exemplary preferred embodiment, the various sources of signals used for the second row select signal are selected by configuring mutually exclusive jumpers (0 Ohm resistors) 273, 274 and 275. In particular, jumper 273 is inserted to enable selection of the second row by use of the CS(1) standard select signal generated by the memory controller. Jumper 274 enables use of the RCS(3) signal generated in response to properly decoded memory access addresses. Jumper 275 enables use of the F64CS signal generated in response to particular memory access addresses. Those skilled in the art will recognize a variety of other programmable chip select signals that may be used in a programmable memory controller to permit flexible generation of the second row select signal applied to the memory modules. The particular signals described in the tables above and shown in FIG. 2 for providing second row select signals to SO-DIMM modules are therefore merely exemplary of one preferred embodiment of the invention. Numerous other configurations will be apparent to those skilled in the art. The selected source for the second row select signal is then applied via path 210 to pin 71 of the SO-DIMM socket.

As noted above, several configurations of memory modules are permitted using the signaling features of the present invention as described above. In particular, the features of the present invention fully support use of standard SDRAM (or other DRAM) SO-DIMM modules. In other words, the features of the present invention retain "backward" compatibility to permit use of existing SDRAM (and other DRAM) SO-DIMM modules. In addition, the features of the present invention allow both SO-DIMM sockets of the system to be populated with single-row modules using memory devices other than DRAMs. For example, both modules may provide synchronous or asynchronous Flash or static RAM devices or combinations of the same. Further, special modules may be used providing SDRAM (or other DRAM) on the front side and Flash or SRAM on the other. Those skilled in the art will recognize a variety of memory configurations enabled by the signaling features of the present invention. Further, those skilled in the art will recognize that a similar jumper structure may be employed for the first row select signal (CS(0)) preferably coupled to pin 69 of the SO-DIMM sockets 200 and 204. Such a structure would permit the added flexibility to allow both rows to utilize asynchronous devices if desired for a particular application.

As noted above, FIG. 2 suggests a first exemplary preferred embodiment wherein the particular configuration of memory devices used on the system is identified by jumpers. Those skilled in the art will recognize a jumper as a switch and therefore recognize a wide variety of equivalent switching means including for example DIP switches of various types and other mechanical and electrical switch devices and means.

In an alternate embodiment representing the best presently known mode of practicing the invention, an enhanced memory module in accordance with the present invention would identify its configuration in returned SPD data. Serial presence detect (SPD) information is usually stored in a read-only memory (i.e., PROM) on standard memory modules. The SPD information includes, among other things, timing, size and geometry parameters of the memory module. These parameters are used by a memory controller to adjust it memory signal timings and other parameters to match the requirements of the module. This SPD information is usually retrieved at boot time or system reset of the system board and is used by low level boot code to configure the memory controller.

In accordance with the best known mode of practicing the invention, an enhanced module of the present invention returns information sufficient to identify the type of memory elements on the module and other parameters related to control of memory access to the module by a memory controller. Those skilled in the art will recognize that official designations of SPD information bit and byte assignments and values are controlled by standards agencies (i.e., JEDEC in the exemplary preferred embodiment utilizing 144-pin SO-DIMM standards). In particular, JEDEC JESD21-C section 4.1.2 defines a standard content for the first 128 bytes of SPD information returned by a memory module. Byte 2 under this standard defines a memory type. At present 7 out of 255 possible memory type values are defined for existing memory modules. A new memory type would preferably be used in the exemplary preferred embodiment of the present invention to identify a memory module populated with Flash or SRAM memory devices (typically addressed as a flat memory space as distinct from a two dimensional array of bits organized according to column addresses and row addresses). With such a new memory type value defined, other standard fields of the SPD information could be coded as appropriate for such "flat" memory devices to define any required memory addressing and timing parameters.

Another aspect of the present invention is the improved immobilization of the DIMM of the present invention to aid in resistance to vibration and shock related failures of the module. As noted above, testing results show that standard SO-DIMM sockets permit some rotation of the module about the mated keys used to help position the module within the socket. Over time, this rotation can wear the edge contacts (signal pads) to the point of premature failure. The invention provides for immobilizing the edge of the module opposite the connector edge that inserts into the socket. The increased immobilization of this edge helps prevent such wear to reduce the potential for premature failure of the module.

The invention broadly provides for any means for immobilizing the module to reduce the undesired rotation of the module within the socket. In particular, the present invention provides for securing the edge opposite the connector edge to the underlying system board on which the socket is also mounted. This serves to match the immobilization of the module with respect to the system board and that of the socket in which the module is inserted for use. The edge so immobilized is fastened to the system board by any of several fastening structures. Those skilled in the art will recognize a wide variety of fastening techniques and structures that may be equivalently employed to secure the edge of the memory module with respect to the socket and with respect to the system board.

Figure 4:
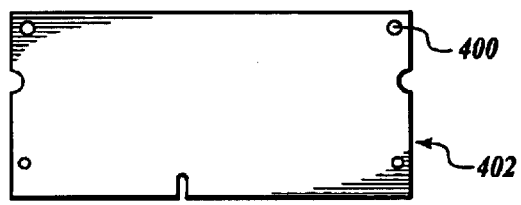
FIG. 4 is a dimensioned diagram of a memory module with holes for securing the module the system board in accordance with one exemplary preferred embodiment of he present invention.
Figure 5:
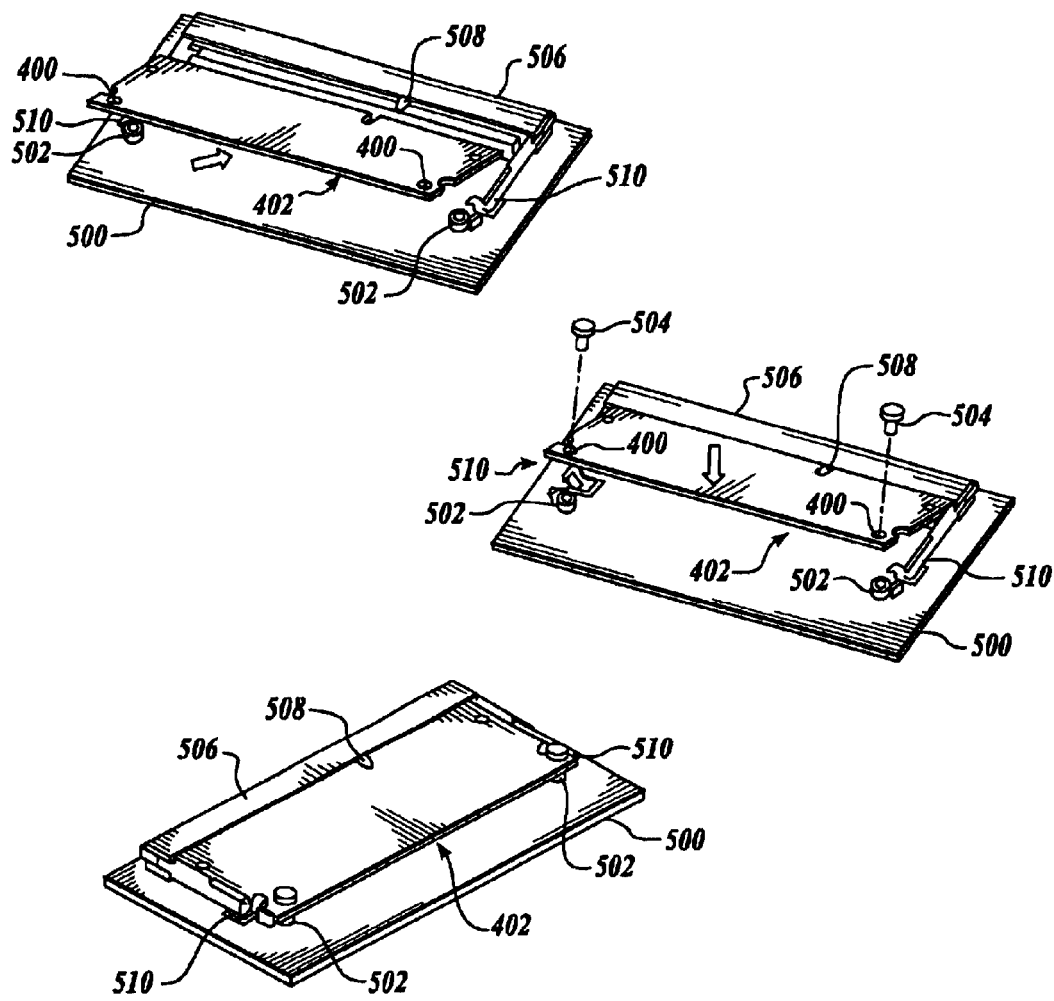
FIG. 5 is a sequence of diagrams depicting insertion of a memory module into a connector socket and securing the module to the system board in accordance with one exemplary preferred embodiment of he present invention.

FIGS. 4 and 5 depict one exemplary preferred embodiment of the invention to secure the memory module to the system board and thereby reduce movement of the module within the mated socket. Specifically, FIG. 4 is a dimensioned mechanical drawing showing mounting holes 400 positioned at the corners of a standard SO-DIMM module 402. The mounting holes are preferably positioned at the corners of the edge of the module opposite the connector edge. FIG. 5 provides further detail of the mounting holes 400 in the DIMM module 402 mated with a connector 506 mounted on a system board 500. Specifically, FIG. 5 provides a sequence of three positions of the module 402 as it is mated with connector 506. Module 402 is first tilted at an angle and its edge connector is inserted into the mated slot of connector 506. A key notch in the module is positioned over the mated key 508 in the socket to ensure accurate positioning of the module within the socket. With the connector edge of the module so inserted in the socket, the module is tilted downward deflecting by cam action retaining spring clips 510 of the socket on each side of the socket 506. When tilted down substantially parallel with the system board. spring clips 510 bias back to normal position to retain module 402 within socket 506. In accordance with the present invention, mounting screws 504 are inserted through mounting holes 400 of the module 402 and mated with standoff nuts 502 affixed to the system board.

In one exemplary preferred embodiment, the improvement of the present invention secures module 402 within socket 506 by inserting screws 504 through mounting holes 400 into nuts 502 on the system board. Those skilled in the art will recognize that the number and position of mounting holes 400 may be varied as a matter of design choice to achieve the desired effect of reducing the motion of the module within the mated socket.

Further, those skilled in the art will recognize that a screw and mated standoff nut type fastener structure is but one of a number of equivalent fastening techniques and structures useful to immobilize the module within the socket. Numerous equivalent examples are readily apparent to those skilled in the art as a matter of design choice. For example, standoff nuts 502 may be soldered components secured to the system board to simplify the manufacture of the system board. Further, other types of fastening systems may be employed. For example, a half card-cage with a channel for gripping the edge of the module opposite its connector edge may be affixed to the system board. The module is inserted in the socket and tilted down to "snap" into the side spring clips 510 as shown in FIG. 5. When in place, the module also snaps into the channel of the half card-cage structure on the system board. Another example uses an elastomer material between the module and the system board to reduce vibrations of the module within its connector socket. Another example provides for a mounting pin affixed to the system board such that the mounting pin enters through the mounting hole and snaps into a locked position to secure the module onto the mounting pin (and hence to the system board). Still another example provides for a pin associated with the socket connector such that the pin inserts through a hole in the module when the module is inserted in the socket. These and other alternative embodiments would be viewed as equivalent means for securing the module to the underlying system board to thereby immobilize the module with respect to the mated connector socket.

While the invention has been illustrated and described in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. A memory module comprising:
   a printed circuit assembly having connector pads at one edge of said assembly; and
   a plurality of memory sockets mounted on said assembly and electrically coupled to said connector pads wherein said printed circuit assembly is adapted to support both synchronous and asynchronous types of said memory devices in the memory sockets.

2. The memory module of claim 1 wherein each of said plurality of memory devices is a synchronous dynamic random access memory device.

3. The memory module of claim 1 wherein each of said plurality of memory devices is a synchronous Flash memory device.

4. The memory module of claim 1 wherein each of said plurality of memory devices is an asynchronous Flash memory device.

5. The memory module of claim 1 wherein each of said plurality of memory devices is an asynchronous static random access memory device.

6. The memory module of claim 1 wherein each of said plurality of memory devices is an asynchronous fast static random access memory device.

7. The memory module of claim 1 wherein each of said plurality of memory devices is an asynchronous low power static random access memory device.

8. The memory module of claim 1 wherein said connector pads include:
   a first select signal connector pad that selects a first subset of memory devices mounted on said module when a signal is applied thereto wherein said first subset of memory devices are synchronous memory devices; and
   a second select signal connector pad that selects a second subset of memory devices mounted on said module when a signal is applied thereto wherein said second subset of memory devices are asynchronous memory devices.

9. The memory module of claim 1 wherein said connector pads include:
   a first select signal connector pad that selects a first subset of memory devices mounted on said module when a signal is applied thereto wherein said first subset of memory devices are synchronous dynamic random access memory devices; and
   a second select signal connector pad that selects a second subset of memory devices mounted on said module when a signal is applied thereto wherein said second subset of memory devices are synchronous Flash memory devices.

10. A system comprising:
    a system board;
    a memory bus adapted for exchanging signals between a memory controller and both synchronous and asynchronous memory devices;
    a memory controller on said system board coupled to said memory bus wherein said memory controller is capable of generating signals for control of both synchronous and asynchronous memory devices and wherein said memory controller is capable of multiplexing said signals on said memory bus;
    a first socket connector on said system board for receiving a first memory module wherein said first socket connector is coupled to said memory controller through said memory bus; and
    a first memory module inserted in said first socket connector and electrically coupled to said memory controller wherein said first memory module includes a plurality of synchronous or asynchronous memory devices.

11. The system of claim 10 further comprising:
    a jumper on said system board for configuring signals exchanged between said memory controller and said first memory module in accordance with the type of memory devices on said first memory module.

12. The system of claim 10 wherein said first memory module provides serial presence detect information used in conjunction with said memory controller to identify the type of memory devices included on said first memory module.

13. The system of claim 10 wherein said first memory module includes a plurality of synchronous dynamic random access memory devices.

14. The system of claim 10 wherein said memory module includes a plurality of asynchronous Flash memory devices.

15. The system of claim 10 wherein said memory module includes both synchronous Flash memory devices and synchronous dynamic random access memory devices.

16. The system of claim 10 wherein said memory module includes both synchronous memory devices and asynchronous memory devices.

17. The system of claim 10 further comprising:
    a second socket connector on said system board for receiving a second memory module wherein said second socket connector is coupled to said memory controller through said memory bus; and
    a second memory module inserted in said second socket connector and electrically coupled to said memory controller wherein said second memory module includes a plurality of synchronous or asynchronous memory devices.

18. The system of claim 17 further comprising:
    a jumper on said system board for configuring signals exchanged between said memory controller and said second memory module in accordance with the type of memory devices on said first memory module and on said second memory module.

19. The system of claim 17
    wherein said first memory module provides serial presence detect information used in conjunction with said memory controller to identify the type of memory devices included on said first memory module, and
    wherein said second memory module provides serial presence detect information used in conjunction with said memory controller to identify the type of memory devices included on said second memory module.

20. The system of claim 17
wherein said first memory module includes a plurality of synchronous dynamic random access memory devices, and
wherein said second memory module includes a plurality of asynchronous Flash memory devices.

21. The system of claim 17
wherein said first memory module includes a plurality of synchronous dynamic random access memory devices, and
wherein said second memory module includes a plurality of asynchronous static random access memory devices.

22. The system of claim 17
wherein said first memory module includes a plurality of asynchronous Flash memory devices, and
wherein said second memory module includes a plurality of asynchronous static random access memory devices.

23. A system comprising:
a system board;
a socket connector on said system board for receiving a memory module wherein said socket connector includes a key;
a memory module having a connector edge inserted in said socket connector and having an opposing edge opposite said connector edge wherein said memory module has a notch mated to said key when said memory module is inserted in said socket connector; and
a memory module retainer adapted to substantially immobilize said opposing edge with respect to rotation about said key.

24. The system of claim 23 wherein said memory module retainer comprises:
a nut affixed to said system board;
a hole in said memory module along said opposing edge and aligned with said nut; and
a screw inserted through said hole into said nut to substantially immobilize said opposing edge with respect to rotation about said key.

25. The system of claim 24 wherein said nut is a swaged extension nut.

26. The system of claim 23 wherein said memory module retainer comprises:
a half card-cage affixed to said system board wherein said half card-cage includes a channel for receiving said opposing edge of said memory module to substantially immobilize said opposing edge with respect to rotation about said key.

27. The system of claim 23 wherein said memory module retainer comprises:
a standoff pin affixed to said system board;
a hole in said memory module along said opposing edge and aligned with said pin wherein said standoff pin extends through said hole and locks when said memory module is completed inserted in said socket connector to substantially immobilize said opposing edge with respect to rotation about said key.

28. The system of claim 23 wherein said memory module retainer comprises:
a standoff pin affixed to said socket connector;
a hole in said memory module aligned with said standoff pin wherein said standoff pin extends through said hole and when said memory module is completed inserted in said socket connector to substantially immobilize said opposing edge with respect to rotation about said key.

29. A system comprising:
a system board;
a socket connector on said system board for receiving a memory module wherein said socket connector includes a key;
a memory module having a connector edge inserted in said socket connector and having an opposing edge opposite said connector edge wherein said memory module has a notch mated to said key when said memory module is inserted in said socket connector; and
memory module retainer means adapted to substantially immobilize said opposing edge with respect to rotation about said key.

30. The system of claim 29 wherein said memory module retainer means comprises:
nut means affixed to said system board;
a hole in said memory module along said opposing edge and aligned with said nut means; and
screw means inserted through said hole into said nut means to substantially immobilize said opposing edge with respect to rotation about said key.

31. The system of claim 30 wherein said nut means is a swaged extension nut.

32. The system of claim 29 wherein said memory module retainer means comprises:
card-cage means affixed to said system board wherein said card-cage means includes a channel for receiving said opposing edge of said memory module to substantially immobilize said opposing edge with respect to rotation about said key.

33. The system of claim 29 wherein said memory module retainer means comprises:
pin means affixed to said system board;
a hole in said memory module along said opposing edge and aligned with said pin means wherein said pin means extends through said hole and locks when said memory module is completed inserted in said socket connector to substantially immobilize said opposing edge with respect to rotation about said key.

34. The system of claim 29 wherein said memory module retainer means comprises:
pin means affixed to said socket connector;
a hole in said memory module aligned with said pin means wherein said pin means extends through said hole and when said memory module is completed inserted in said socket connector to substantially immobilize said opposing edge with respect to rotation about said key.

35. A memory module comprising:
a printed circuit assembly having connector pads at one edge of said assembly;
a plurality of memory devices mounted on said assembly and electrically coupled to said connector pads wherein said printed circuit assembly is adapted to support both synchronous and asynchronous types of said memory device, wherein said connector pads include:
a first select signal connector pad that selects a first subset of memory devices mounted on said module when a signal is applied thereto wherein said first subset of memory devices are synchronous memory devices; and a second select signal connector pad that selects a second subset of memory devices mounted on said module when a signal is applied thereto wherein said second subset of memory devices are asynchronous memory devices.

36. A memory module comprising:

a printed circuit assembly having connector pads at one edge of said assembly;

a plurality of memory devices mounted on said assembly and electrically coupled to said connector pads wherein said printed circuit assembly is adapted to support both synchronous and asynchronous types of said memory device, wherein said connector pads include:

a first select signal connector pad that selects a first subset of memory devices mounted on said module when a signal is applied thereto wherein said first subset of memory devices are synchronous dynamic random access memory devices; and a second select signal connector pad that selects a second subset of memory devices mounted on said module when a signal is applied thereto wherein said second subset of memory devices are synchronous Flash memory devices.

* * * * *